(12) United States Patent
Takada (10) Patent No.: US 8,237,532 B2
(45) Date of Patent: Aug. 7, 2012

(54) ELECTRONIC CIRCUIT DEVICE

(75) Inventor: Ryuji Takada, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 12/617,002

(22) Filed: Nov. 12, 2009

(65) Prior Publication Data

US 2010/0148910 A1   Jun. 17, 2010

(30) Foreign Application Priority Data

Dec. 11, 2008   (JP) .................................. 2008-315275

(51) Int. Cl.
    *H01F 5/00*    (2006.01)
    *H01F 27/02*   (2006.01)
    *H01F 27/28*   (2006.01)

(52) U.S. Cl. ........................ 336/200; 336/96; 336/232

(58) Field of Classification Search .................. 336/96, 336/200, 232

See application file for complete search history.

(56) References Cited

U.S. PATENT DOCUMENTS

| | | | |
|---|---|---|---|
| 4,112,481 A * | 9/1978 | Roge et al. | 361/736 |
| 4,628,148 A * | 12/1986 | Endou | 174/532 |
| 5,034,854 A * | 7/1991 | Matsumura et al. | 361/744 |
| 6,087,917 A * | 7/2000 | Roessler et al. | 336/96 |
| 6,741,155 B2 * | 5/2004 | Usui | 336/200 |
| 2002/0109572 A1 * | 8/2002 | Inoue et al. | 336/200 |
| 2004/0070480 A1 * | 4/2004 | Nakashima et al. | 336/200 |
| 2008/0017408 A1 * | 1/2008 | Morishita et al. | 174/260 |

FOREIGN PATENT DOCUMENTS

| | | |
|---|---|---|
| JP | 57-125542 | 1/1981 |
| JP | 3-12906 | 1/1991 |
| JP | 6-45318 | 6/1994 |
| JP | 06163278 A * | 6/1994 |
| JP | 09-321182 | 12/1997 |
| JP | 2000-228482 | 8/2000 |
| JP | 2002-164229 | 6/2002 |

OTHER PUBLICATIONS

Japanese Office Action; JP Application No. 2008-315275 (dated May 29, 2012 (w/Partial English Translation)).

* cited by examiner

*Primary Examiner* — Elvin G Enad
*Assistant Examiner* — Tsz Chan
(74) *Attorney, Agent, or Firm* — Oblon, Spivak, McClelland, Maier & Neustadt, L.L.P.

(57) ABSTRACT

An electronic circuit device 1 arranged with a first substrate 11, a core 33 (magnetic body) mounted on the first substrate 11, a resin sealing body 17 which covers the first substrate 11 and the core 33, and a curable type stress relieving material 35 which reduces stress applied to the core 33 by the resin sealing body 17 is arranged within the resin sealing body 33 from the side surface periphery of the core 33 across to the first substrate 11.

3 Claims, 8 Drawing Sheets

| Sample | Curable type stress relieving material | Efficiency η (%) before molding | Efficiency η (%) after molding | Difference between before and after molding Δ (%) |
|---|---|---|---|---|
| 1 | not arranged on the core | 93.0 | 91.31 | 1.69 |
| 2 | arranged around the core | 92.77 | 92.43 | 0.34 |
| 3 | arranged at the whole core | 92.72 | 92.37 | 0.35 |

ELECTRONIC CIRCUIT DEVICE

CROSS REFERENCE TO RELATED APPLICATION

This application is based upon and claims the benefit of priority from the prior Japanese Patent Application No. 2008-315.275 filed on Dec. 11, 2008, the entire contents of which is incorporated herein by reference.

BACKGROUND OF THE INVENTION

1. Field of the Invention

The present invention is related to an electronic circuit device and in particular, is related to an electronic circuit device which includes a magnetic body within a resin sealing body and which his used as a power supply module included in a power supply unit.

2. Description of the Related Art

For example, a DC-DC converter is incorporated in a power supply unit of a general purpose television. The DC-DC converter, for example, coverts a direct current voltage converted from a general household 100 V alternating current, into an alternating current used in a control circuit unit or drive circuit unit. The DC-DC converter finally produces a 12 V or 24 V direct current voltage.

Thinner and smaller scale power supply units are an important issue in the development of general purpose televisions such as LCD and plasma televisions which tend to have thin, flat and large screens. If a electronic circuit device in which a plurality of electronic parts which form a DC-DC converter are packaged is manufactured as one power supply module, it becomes easier to realize thinner and smaller scale power supply units and more easily manageable when incorporating these power supply units within electronic circuit devices.

In a DC-DC converter, a transformer is used in direct current voltage conversion. The transformer is arranged with a core comprised of a magnetic body material and a coil wound around the core. For example, in the case where a transformer is made into a resin mold using a transfer mold technique, there is concern that the stress produced from the difference between the linear expansion coefficient of the core of a transformer and the linear expansion coefficient of the resin, will extend to the core.

A stress relieving transformer which relieve stress and impact cause by resin after the resin is molded and which is strong to the degradation of magnetic properties or breaks in the core is disclosed in Japanese Laid Open Patent 2002-164229 (Patent Document 1).

This stress relieving transformer includes a ferritic core and a coil bobbin and the entire surface of the ferritic core and a gap between the ferritic core and coil bobbin is covered by a buffer resin and also includes a structure which covers the exterior of this buffer resin with an outer layer resin which has a high Young modulus.

In addition, a ferritic core is disclosed in Japanese Laid Open Patent 1991-012906 (Patent Document 2) in which the surface of a ferritic core is covered by an interior layer which is comprised from a resin which has excellent elastic properties and this interior layer is further coated with an exterior resin layer which has excellent electrical insulation properties.

However, the following points were not considered in the stress relieving transformer disclosed in Patent Document 1 and the ferritic core disclosed in Patent Document 2 stated above.

The stress relieving transformer disclosed in Patent Document 1 has a ferritic core and coil bobbin which are covered by two layers comprising the buffer resin and exterior resin layer and moreover has a structure which covers the entire ferritic core. However, the main body of the ferritic core disclosed in the Patent Document 2 is covered by two layers comprising an interior layer and an exterior resin layer and the ferritic core has a structure which covers the entire body. Both have a two layered resin structure and while the structures become complex, overall they are thin and it is difficult to simultaneously realize relief of the stress produced on the ferritic core and thin and small scale electronic circuit devices which uses this ferritic core.

SUMMARY OF THE INVENTION

The present invention is performed to solve the problems stated above. Therefore, the present invention can provide an electronic circuit device in which stress produced on a magnetic body can be reduced and can also realize thinness and small scale.

In order to solve the above stated problems, a first feature of the embodiments of the present invention is an electronic circuit device including a substrate, a magnetic body mounted on the substrate, and a resin sealing body which covers the substrate and the magnetic body, wherein a curable stress relieving material which reduces stress applied to the magnetic body by the resin sealing body, is arranged from a periphery of a side surface of the magnetic body across the substrate within the resin sealing body.

In the electronic circuit device related to the first feature of the embodiments, it is preferred that a film thickness of the curable stress relieving material from the surface of the substrate is formed thinly as the gradually departs from the side surface of the magnetic body.

In the electronic circuit device related to the first feature of the embodiments, it is preferred that a dam is further included arranged on a surface of the substrate in a periphery which is separated from the side surface of the magnetic body, wherein the curable stress relieving material is arranged in a depression produced by the side surface.

In the electronic circuit device related to the first feature of the embodiments, it is preferred that the curable stress relieving material is further arranged on a top surface of the magnetic body, and the film thickness of the curable stress relieving material from the top surface of the magnetic body is set thinly with respect to the film thickness of the curable stress relieving material at a point half the width from the side surface to the end of the magnetic body.

A second feature related to the embodiments of the present invention is an electronic circuit device including a substrate, electronic parts having a core formed from a stacked substrate arranged with a winding wire, and a magnetic body wedged in a part of the stacked substrate, the electronic parts being mounted on the substrate, and a resin sealing body which covers the substrate and the electronic parts, wherein a curable stress relieving material which reduces stress applied to the core by the resin sealing body, is arranged from the periphery of a side surface of electronic parts across the substrate within the resin sealing body.

In the electronic circuit device related to the second feature of the embodiments, it is preferred that the curable stress relieving material is also arranged in a connection region between the stacked substrate of the electronic parts and the substrate.

In the electronic circuit device related to the second feature of the embodiments, it is preferred that the curable stress relieving material is a silicon resin or an epoxy resin of one of either a thermal curable type, ultraviolet curable type or room temperature curable type, and the resin sealing body is an epoxy resin.

DETAILED DESCRIPTION OF THE INVENTION

Next, the embodiments of the present invention will be described with reference to the attached drawings. Like or corresponding parts are denoted by like or corresponding reference numerals. The drawings are schematic, and may sometimes differ from actual components. Further, dimensions and ratios of components may be different between drawings.

In addition, while the invention herein is disclosed by means of specific embodiments and applications thereof, numerous modifications and variations could be made thereto without departing from the scope of the invention set forth in the claims.

(First Embodiment)

The first embodiment of the present invention explains an example which applies the present invention to an electronic circuit device as a power supply module. Here, the electronic circuit device is a DC-DC converter.

[System Block Structure of the Electronic Circuit Device]

Figure 6:
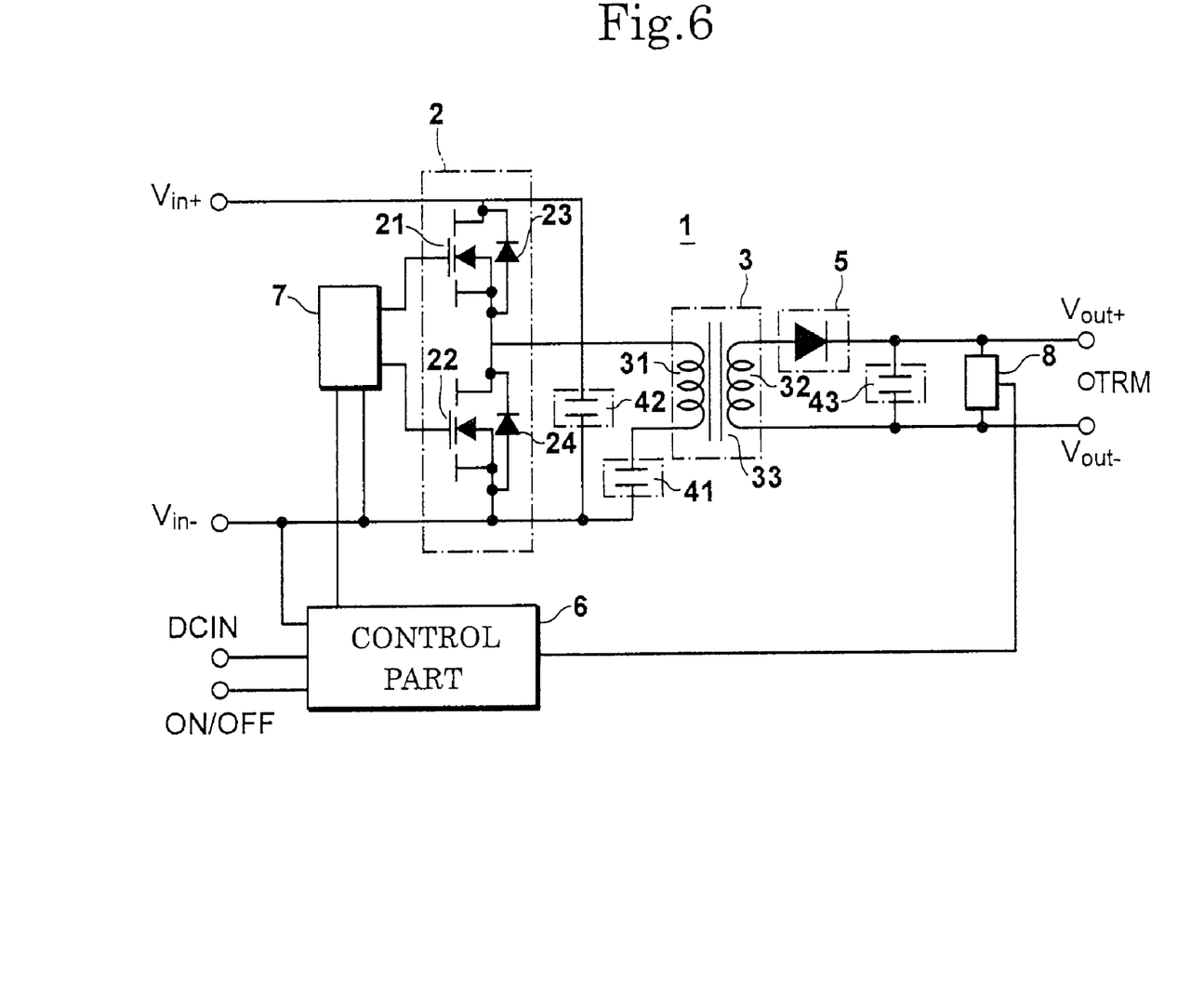
FIG. 6 is a system block diagram of the electronic circuit diagram shown in FIG. 2.

As is shown in FIG. 6, an electronic circuit device 1 related to the first embodiment is structured from a DC-DC converter as a power supply module (electronic components). This electronic circuit device 1 is arranged with at least a transistor part 2, a first transformer 3, condensers 41, 42, 43, a diode 5, a control part 6, a second transformer 7 and a temperature sensing part 8. In addition, the electronic circuit device 1 arranged with an input terminal Vin+, Vin−, output terminal Vout+, Vout−, direct current voltage terminal DCIN, cut off signal terminal ON/OFF, and an output voltage adjustment terminal TRM.

The transistor part 2 is arranged with a first insulation gate type transistor (below referred to simply as IGFET (insulated gate field effect transistor)) 21, a second IGFET 22, and diodes 23 and 24. Here, IGFET is used meaning to include a MOSFET (metal oxide semiconductor field effect transistor) or a MISFET (metal insulated semiconductor field effect transistor). Furthermore, if it has similar functions, the present embodiment is not limited to an IGFET, for example, an IGBT (Insulated Gate Bipolar Transistor) can also be used in the transistor part 2.

One end of a main electrode of the first IGFET 21 is connected to the input terminal Vin+, and the other end of the main electrode is connected to one end of the main electrode of the second IGFET 22, and a gate electrode is connected to the second transistor 7. A diode 23 is arranged in a reverse bias direction between one end and the other end of the main electrode of the first IGFET 21. The other end of the main electrode of the second IGFET 22 is connected to the input terminal Vin− and a gate electrode is connected to the transformer 7. A diode 24 is arranged in a reverse bias direction between one end and the other end of the main electrode of the second IGFET 22. In addition, the condenser 42 is arranged between the input terminal Vin+ and Vin−.

The first transformer 3 is arranged with a primary coil 31, a secondary side 32 and a core 33. One end of the primary side coil 31 is connected to the output of the transistor part 2, that is, the other end of the main electrode of the first IGFET 21 and one end of the main electrode of the second IGFET 22, and the other end of the primary side coil 31 is electrically connected in series to the input terminal Vin− via the condenser 41. One end of the secondary side coil 32 is connected in series to the output terminal Vout+ via the diode 5 and the other end is connected to the output terminal Vout−.

The condenser 43 and temperature sensing part 8 are each inserted electrically and in parallel between the output terminal Vout+ and Vout−. The temperature sensing part 8 senses the temperature of the electronic circuit device 1 and outputs the sensed result to the control part 6. Based on the sensed result from the temperature sensing part 8, the control part 6 can terminate the operation of the transistor part 2 via the second transformer 7 in the case where an increase in a temperature set in advance is sensed.

Although not shown in FIG. 6, the control part 6 is arranged with at least a control IC and a photocoupler. This control part 6 controls the operation of the DC-DC converter of the electronic circuit device 1 based on a cut off signal input from the cut off signal terminal ON/OFF.

[Operation of the Electronic Circuit Device]

In the electronic circuit device 1 related to the first embodiment shown in FIG. 6. First, a direct current voltage before conversion is provided between the input terminal Vin+ and Vin−, a direct current voltage of 12 V for example, is supplied to a direct current voltage terminal DCIN, and a cut off signal (initiate signal) of the electronic circuit device 1 is provided to the cut off signal terminal ON/OFF. When an ON signal is provided to the cut off signal terminal ON/OFF, the control part 6 causes an ON operation of the first IGFET 21 of the transistor part 2 and causes an OFF operation of the second IGFET 22 via the second transformer 7. By the ON operation of the first IGFET 21, a direct current flows from the transistor part 2 (other end of the main electrode of the first IGFET 21) to the primary side coil 31 of the first transformer 3. When a direct current flows to this primary side coil 31a direct current is produced in the secondary side coil 32 due to the effects of electromagnetic induction. This direct current voltage is output as a direct current voltage conversion between the output terminal Vout+ and Vout−.

In the electronic circuit device 1 related to the first embodiment, a direct current voltage before conversion is, for example, 385V and a direct current voltage after conversion is, for example, 12 V or 24 V.

[Device Structure of the Electronic Circuit Device]

As is shown in FIG. 1 to FIG. 5, the electronic circuit device 1 related to the first embodiment is arranged with a first substrate 11, a second substrate (stacked substrate) 12 mounted on the first substrate and arranged with a coil (primary side coil 31 and secondary side coil 32), a first transformer (electronic components) 3 which includes a core 33 which is comprised from a magnetic body which wedges a part of this second substrate 12, a resin sealing body 17 which coats the first substrate 11 and first transformer 3, and a curable type stress relieving material 55 which reduces the stress provided to the core by the resin sealing body 17 is arranged from a side surface periphery of the core 33 of the first transformer 3 across the first substrate 11 within the resin sealing body 17. In the electronic circuit device 1, the second substrate 12 is mounted within a first aperture 15 formed on the first substrate 11 which is mounted with electronic components other than the first transformer 3 of for example, the transistor part 2, condensers 41, 42, 43, diode 5 and control part 6. And the first substrate 11 and the second substrate 12 are structured as one power supply module which performs mold packaging by the resin sealing body 17.

[Structure of the First Substrate of the Electronic Circuit Device 1]

Figure 1:
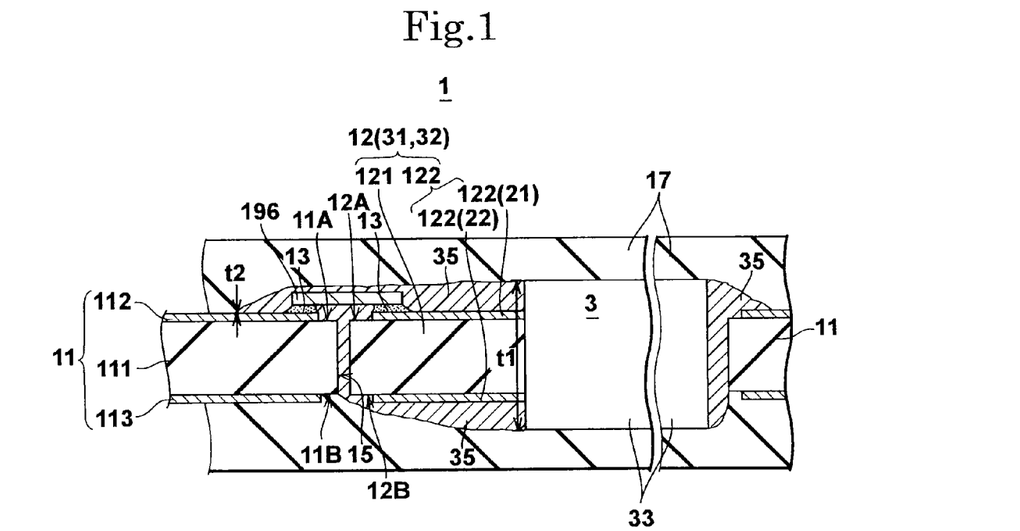
FIG. 1 is an enlarged cross sectional diagram of the main components of an electronic circuit device related to a first embodiment of the present invention.

As is shown in FIG. 1 to FIG. 5 and particularly FIG. 1, the first substrate 11 of the electronic circuit device 1 is not limited in the number of stacked layers, however, in the first embodiment, the first substrate 11 is structured from a single layer structure having a first insulation substrate 111. A first conductor 112 is arranged on the top side surface of the first insulation substrate 111, and a first conductor 113 is arranged on the bottom side surface which opposes the top side surface if the first insulation substrate 111. Here, the first insulation substrate 111 has a single layer structure. However, the first insulation substrate 111 may have a multi layer structure of two or more layers.

In the first insulation substrate 111 of the first substrate 11 in the first embodiment is formed by a glass epoxy resin which is heavily used in a printed wiring board. In this first insulation substrate 111, a glass epoxy resin having the qualities of a glass transition temperature Tg of 170° C. for example, an XY direction linear expansion coefficient of $13 \times 10^{-6}/°$ C., and a Z direction linear expansion coefficient of $60 \times 10^{-6}/°$ C. can be practically used. Because the glass epoxy resin has glass fibers it has anisotropic characteristics in which it is difficult to expand in an XY direction and easy to expand in a Z direction. Here, the XY direction is the same face direction as the face on which the mounted components of the first substrate 11 are mounted and the Z direction is the thickness direction of the first substrate 11 or the normal direction with respect to the face on which the mounted components are mounted. While not always limited to these numerical values the first substrate 11 has a rectangular planar shape with the long side set at 60 mm-62 mm, and the short side set at 42 mm-44 mm for example. The thickness of the first substrate 11 is set at 0.8 mm-1.6 mm for example.

The first conductors 112 and 113 of the first substrate 11 in the first embodiment are formed by a material having excellent conducting properties such as copper (Cu), an alloy Cu, or gold (Au). For example, in the case where Cu is used, a Cu foil attached by a laminate method or a plurality of stacked films of Cu plating formed by a plating method on the surface of this Cu foil s used. In the case where a single layer of Cu foil is used, the film thickness is set, for example, at 30 μm-40 μm. In addition, in the case where a plurality of films are used, the thickness of the Cu foil film is set at, for example, 15 μm-20 μm and the Cu plating layer is set at, for example, 15 μm-25 μm.

The transistor part 2, first transformer 3, condensers 42, 43, diode 5, control part 6, second transformer 7 and temperature sensing part 8 shown in FIG. 6 stated above are mounted as electronic components on the surface 11A of the side on which the first conductor 112 of the first substrate 11 is arranged. The condenser 31 is arranged as an electronic component on the surface (back side) 11B of the side opposing the surface 11A of the first substrate 11.

The transistor part 2 is arranged and constructed with a semiconductor in which a semiconductor chip which includes the first IGFET 21 and the diode 23 is sealed by the resin sealing body, and similarly a semiconductor in which a semiconductor chip which includes the second IGFET 22 and the diode 24 is sealed by the resin sealing body. The transistor part 2 is arranged on the surface 11A of the first substrate 11, on the lower right side of a periphery region (first region) in FIG. 4.

The condenser 42 is formed for example by sealing the condenser body by the resin sealing body. In the first embodiment it is possible to practically use a glass epoxy resin in the resin sealing body. The number of condensers 42 which are mounted is not limited depending on the purpose of the capacity. However, four are arranged on the surface 11A of the first substrate 11, on the lower right side of a periphery region (first region) in FIG. 4. The condenser 43 is formed for example by sealing the condenser body by the resin sealing body The number of condensers 43 are which are mounted is similarly not limited depending on the purpose of the capacity, however, six are arranged on the surface 11A of the first substrate 11, on the lower left side of a periphery region (first region) in FIG. 4.

The diode 5 is formed for example by sealing the condenser body by the resin sealing body. The number of diodes 5 are which are mounted is not limited depending on the purpose of the capacity, however, six are arranged on the surface 11A of the first substrate 11, on the left side (along the left edge of the first substrate 11) of a periphery region (first region) in FIG. 4.

The control part 6 is arranged and structured by a semiconductor device (control IC) 61 in which a semiconductor chip having a circuit which controls at least a transistor, logic circuit, capacitor and transistor part 2, is sealed by the resin sealing body, and photocouplers 62 and 63. The semiconductor device 61 of the control part 6 is arranged on the surface 11A of the first substrate 11, on the upper right side of the periphery region (first region) in FIG. 4. The photocouplers 62 and 63 are arranged on the surface 11A of the first substrate 11, on the upper left side in FIG. 4.

Figure 4:
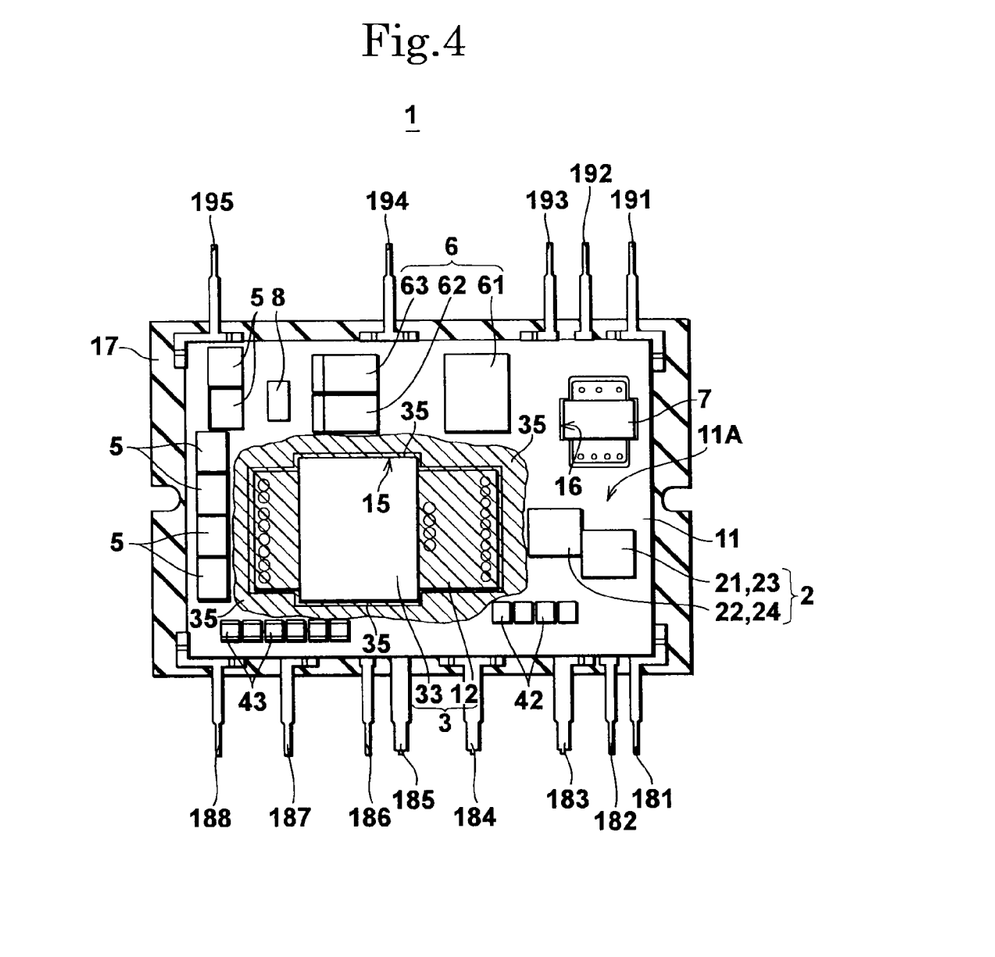
FIG. 4 is a planar view diagram of the electronic circuit diagram shown in FIG. 2.
Figure 5:
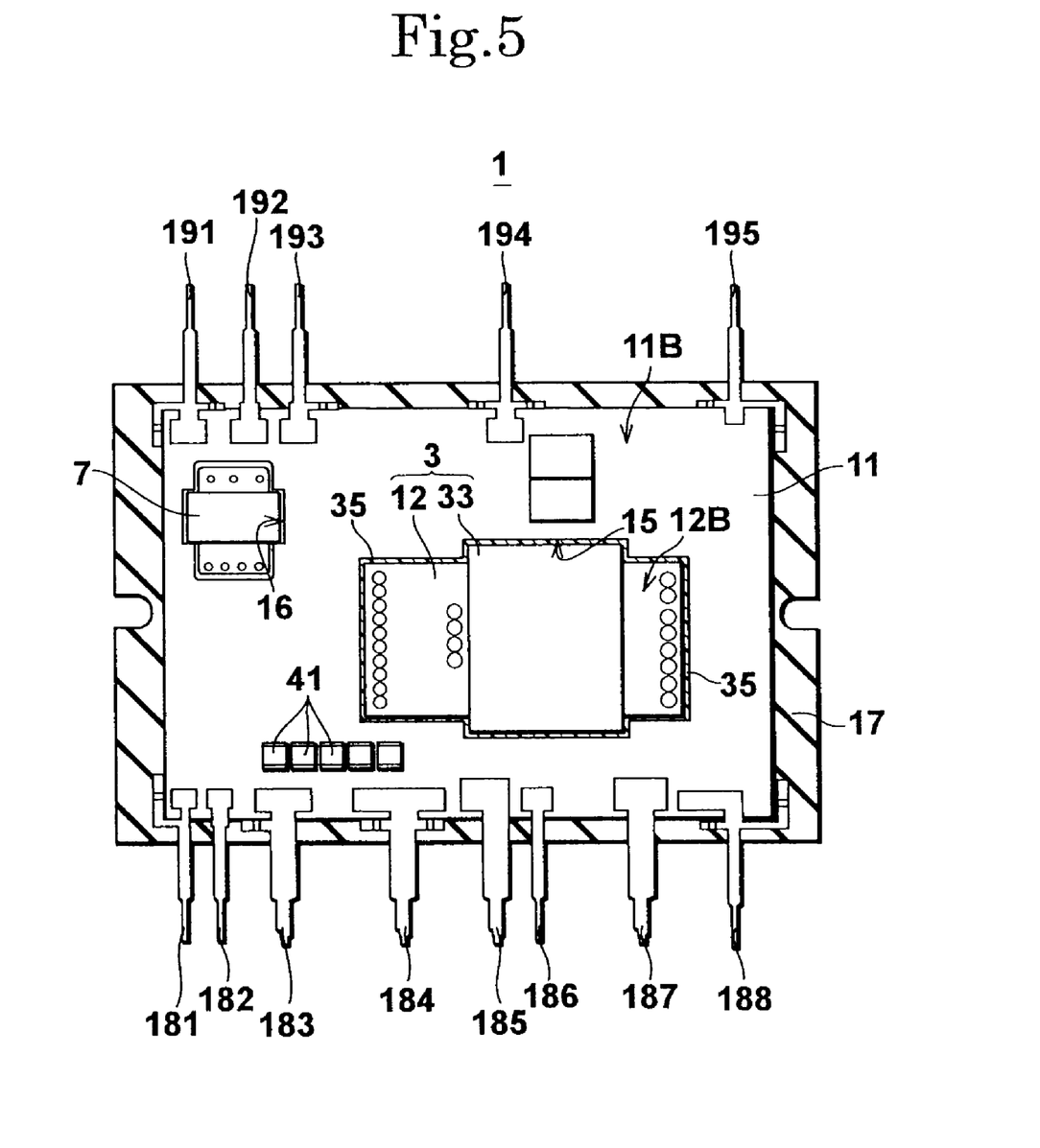
FIG. 5 is a bottom surface view diagram of the electronic circuit diagram shown in FIG. 2.

The temperature sensing part 8 is arranged between the diode 5 and photocouplers 62 and 63 on the surface 11A of the first substrate 11, on the upper left side of the periphery region (first region) in FIG. 4.

As is shown in FIG. 1, the first transformer 3 is inserted and arranged within an aperture 15 in the central region (second region) in FIG. 4 of the surface 11A of the first substrate 11. In the first embodiment, the aperture 15 is formed from the surface 11A of the first substrate 11 via a through hole which passes through to the surface 11B (back surface) which opposes the surface 11A. The details of the structure of the first transformer 3 and the insertion state into the aperture 15 are explained later. The second transformer 7 is inserted and arranged within an aperture 16 in the periphery region (first region) in FIG. 4 of the surface 11A of the first substrate 11.

The structure of the aperture 16 is the same as the aperture 15. In addition, because the details of the structure of the second transformer 7 and the insertion state into the aperture 16 is the same as the details of the structure of the first transformer 3 and the insertion state into the aperture 15, this explanation will be omitted.

In addition, the condenser 41 is formed the same as the previously stated condensers 42 and 43, by, for example, sealing the condenser main body by the resin sealing body. The number of condensers 41 which are mounted is not limited depending on the purpose of the capacity, however, five are arranged on the surface 11B (back surface) of the first substrate 11, on the lower left side of the periphery region (first region) in FIG. 5. This condenser 41 is arranged in a position which opposes an arrangement position of the condenser 42.

[Structure of the Second Substrate (First Transformer)]

The first transformer 3 of the electronic circuit device 1 related to the first embodiment adopts a sheet transformer structure. That is, the first transformer 3 includes a primary side coil 31 and secondary coil 32 as is shown in FIG. 1 and FIG. 7, and is also arranged with a second substrate 12 which has a through hole 125 in the central area, and a core 33 which is arranged along a part of the surface 12A, the surface 12B (back surface) which opposes the surface 12A, and a side surface 12C of the second substrate.

Figure 7:
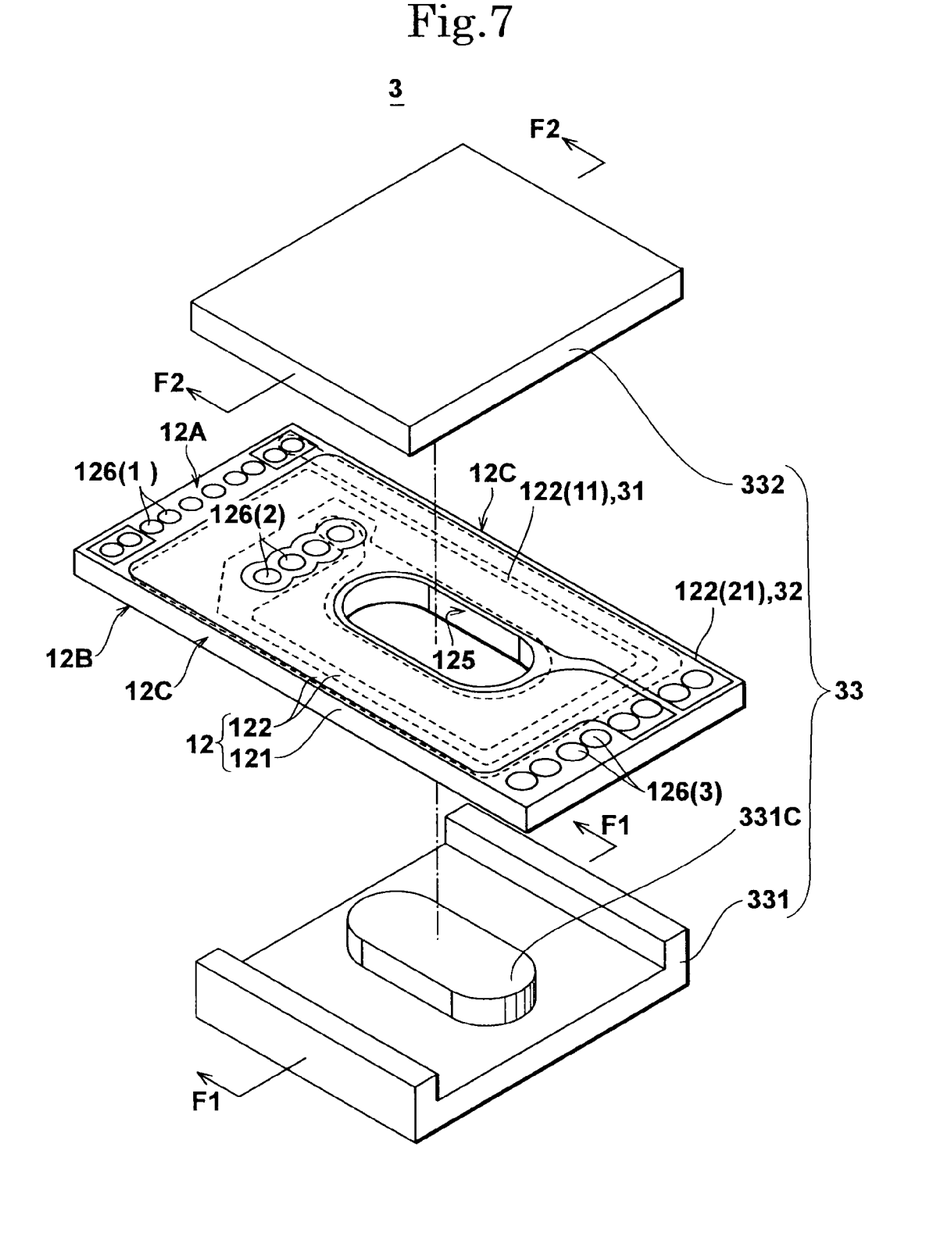
FIG. 7 is an exploded perspective view diagram of a first transformer of the electronic circuit device shown in FIG. 2.
Figure 8:
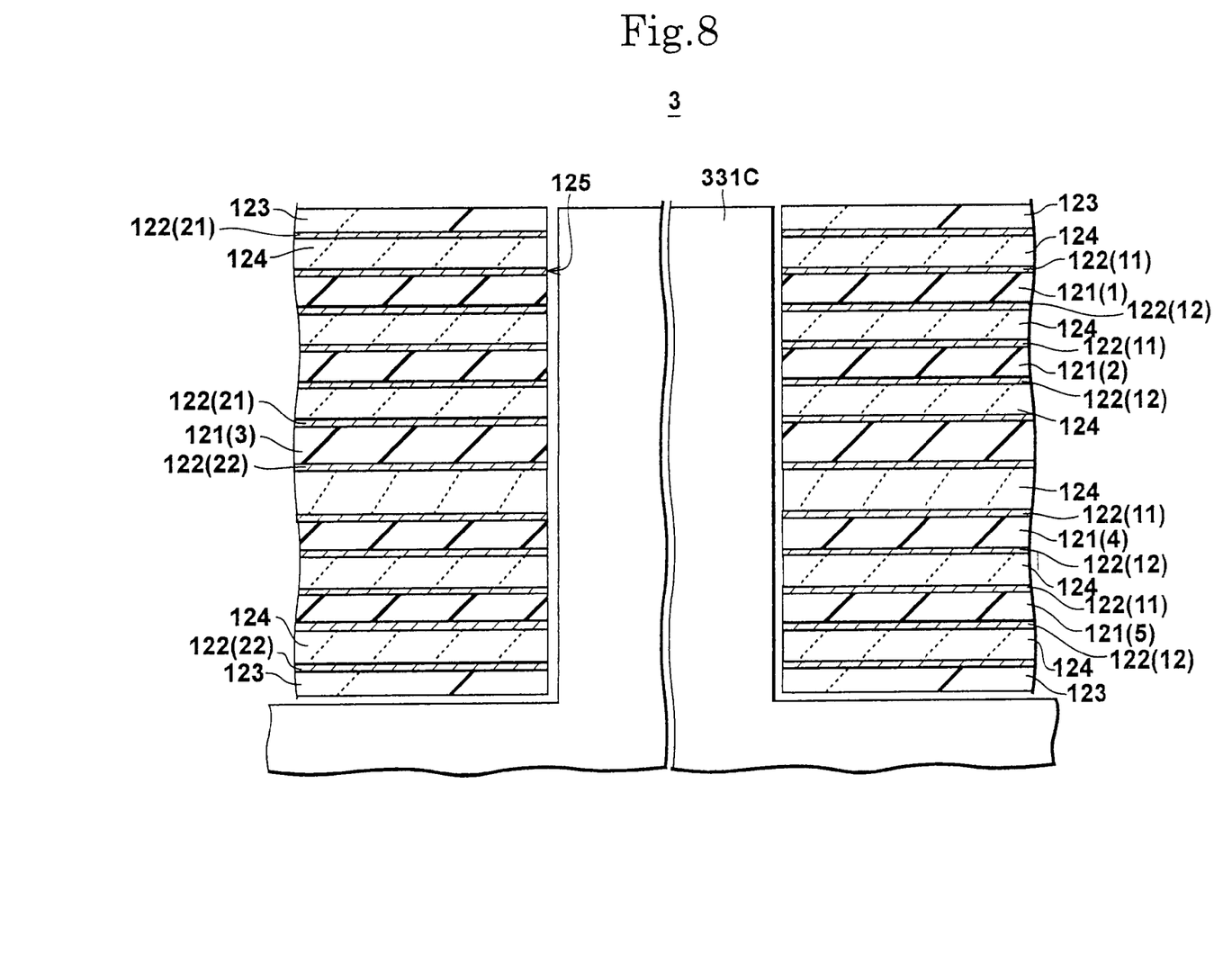
FIG. 8 is an enlarged cross sectional diagram of the main components of the first transformer shown in FIG. 7.

The second substrate 12 is a plate shaped substrate having a rectangular planar shape which has two opposing long sides and two opposing short sides as is shown in FIG. 7. This second substrate 12 is structured by mainly stacking a plurality of layers of a second insulation substrate 121 as is shown in FIG. 8. The number of these stacked layers is not always limited, however, in the first embodiment, the second substrate 12 is structure by stacking a total of five layers of the second insulation substrate 121 from the uppermost layer of the second insulation substrate 121(1) up to the lowermost layer of the second insulation substrate 121(5).

In the first embodiment, one part of a second conductor 122(21) which forms the secondary side coil 32 is arranged via an adhesion layer 124 on the surface of the surface 12A side of the second substrate of the uppermost layer of the second insulation substrate 121(1). In addition, although the planar shape and connection position of the second conductor 122 is slightly different, one part of the second conductor 122(21) which forms the secondary side coil 32 is arranged on a center layer, for example on the surface of the second insulation substrate 121(3), and the second conductor 122 (22) is arranged on the opposing surface (back surface) of the surface 12B side of the second substrate 12, the same as the second conductor 122(21) which is arranged on the surface of the adhesion layer 124. Furthermore, one part of the second conductor 122(22) which forms the secondary side coil 32 is arranged via an adhesion layer 14 on the surface (back surface) of the lowermost layer of the second insulation substrate 121(3). The second conductor 122(21) and 122(22) which are arranged on the surface of the adhesion layer 14 and the second insulation substrate 121(3) are electrically connected via a connection hole wire 126(3) which is arranged along one short edge side of the second insulation substrate 121. That is, each layer of the second conductor 122(21) and 122(22) are electrically connected in series so that a screw shape is formed with the aperture 125 at the center, forming the secondary side coil 32.

Alternatively, one part of the second conductor 122(11) which forms the primary side coil 31 is arranged on the surface of the surface 12A of the second substrate 12 of the uppermost layer of the second insulation substrate 121(1). One part of the second conductor 122(12) which forms the primary side coil is similarly arranged on the surface (back surface) of the surface 12B of the second substrate 12 of the second insulation substrate 121(1). The second conductors 122(11) and 122(12) which are arranged on both surfaces of this second insulation substrate 121(1) are electrically connected via a connection hole wire 126(1) which is arranged along the other short edge side of the second insulation substrate 121(1) and via a connection hole wire 126(2) which is arranged between this other short edge and the aperture 125.

In addition, although the arrangement positions which use the planar shape of the second conductor 122 and the connection hole wires 126(1) and 126(2) are slightly different, one part of the second conductor 122(11) which forms the primary side coil 31 is arranged on the surface of the second, second insulation substrate 121(2) from the uppermost layer, and one part of the second conductor 122(12) which forms the primary side coil 31 is arranged on the back surface. The second conductors 122(11) and 122(12) which are arranged on both surfaces of the of this second insulation substrate 121(22) are electrically connected via the connection hole wires 126(1) and 126(2).

Furthermore, one part of the second conductor 122(11) which forms the primary side coil 31 is arranged on the surface of the fourth second insulation substrate 121(4) from the uppermost layer, and the lowermost second insulation substrate 121(5), and one part of the second conductor 122 (12) which forms the primary side coil 31 is arranged on the back surface. The second conductors 122 (11) and 122 (12) which are arranged on both surfaces of these second insulation substrates 121 (4) and 121 (5) are electrically connected via connection hole wires 126 (1) and 126 (2). That is, each layer of the second conductor 122 (11) and 122 (12) are electrically connected in series via the connection holes wires 126 (1) and 126 (2) so that a screw shape is formed with the aperture 125 at the center, forming the primary side coil 31.

The second insulation substrate 121 of the second substrate 12 in the first embodiment is formed by a glass epoxy resin which is the same material as the first insulation substrate 111 of the first substrate 11. In the second insulation substrate 121, a glass epoxy resin having the qualities of a glass transition temperature Tg of 175° C. for example, an XY direction linear expansion coefficient of $12 \times 10^{-6}$/° C. to $14 \times 10^{-6}$/° C., and a Z direction linear expansion coefficient of $50 \times 10^{-6}$/° C. can be practically used.

In a manufacturing method of the electronic circuit device 1, heat is added to the first transformer 3 when the resin sealing body 17 is formed by a transfer mold method. The amount of transformation of the second substrate 12 by this heat is significantly reduced and in order to maintain the characteristics of the first transformer 3 the glass transition temperature Tg of the second insulation substrate 121 of the second substrate 12 is set higher than the glass transition temperature Tg of the resin sealing body 17. In the first embodiment, the glass transition temperature Tg of the second insulation substrate 121 of the second substrate becomes higher compared to the glass transition temperature Tg of the first insulation substrate 111 of the first substrate 11. Because the glass transition temperature Tg of the second insulation substrate 121 is set higher than as stated above, while only a small amount, the linear expansion coefficient of the second insulation substrate 121 is different with respect to the linear expansion coefficient of the first insulation substrate 111 of the first substrate 11.

Although these numerical values are not absolutely limited in the electronic circuit device related to the first embodiment, the second insulation substrates 121(1) to 121(5) of the second substrate 12 each have a rectangular shape in which the long edges of are set to, for example. 32 mm-34 mm, and the short edges are set to 15 mm-17 mm. The thickness of each of the second insulation substrates 121(1) to 121(5) is set for example, to 55 μm-65 μm and the entire thickness of the second substrate 12 is set to 1.5 mm-1.7 mm including a resist layer 123 and the adhesion layer 124 which are described below.

The second conductor 122 of the second substrate 12 in the first embodiment is formed by a material having excellent conducting properties such as copper (Cu), an alloy Cu, or gold (Au). For example, in the case where Cu is used, The second conductors 122 (21) and 122 (22) which are arranged on the surface of each of the adhesion layers 124 on the uppermost and lowermost layers are formed by a plurality of stacked compound films of Cu foil attached by a laminate method and Cu plating formed by a plating method of the surface of the Cu foil. The film thickness of these compound films of Cu is set at, for example, 15 μm-20 μm and the Cu plating layer is set at, for example, 15 μm-25 μm.

In addition, each of the second conductors 122(11), 122(12), 122(21) and 122(22) of the second insulation substrates 121(1) to 121(5) are formed by Cu foil attached by a laminate method. The film thickness of the Cu foil is set, for example, at 30 μm-40 μm.

A resist layer 123 is arranged on the surface of the adhesion layer 124 and second conductor 122(21) the surface 12A side of the second substrate 12, and the surface of the adhesion layer 124 and the second conductor 122(22) of the surface 12B side of the second substrate 12. It is possible to use a solder resist layer for this resist layer 123 for the purpose of protection of the second conductor 122(21) and protection of a solder attachment. The thickness of this solder resist layer set at, for example, 25 μm-35 μm.

Furthermore, an adhesion layer 124 which adheres an upper and lower second insulation substrate 121 together is arranged between each layer of the second insulation substrate 121 of the second substrate 12. It is possible to use an epoxy based adhesive or glass cloth including an adhesive with folded glass fibers as the adhesive layer 124. In the case where an epoxy based adhesive is used, the film thickness is set, for example, at 50 μm-140 μm.

As is shown in FIG. 7 and FIG. 8, a through hole 125 which is arranged in a center part of the second substrate 12 passes through the center of the primary side coil 31 and the secondary side coil 32 and is formed along these from the uppermost layer of the second insulation substrate 121(1) across to the lowermost layer of the second insulation substrate 121(5). The through hole 125 is arranged at the center part between the connection hole wires 126(2) and 126(3) of the second substrate 12 and has an oblong planar shape elongate along the long edge of the second substrate 12 in the first embodiment.

[Structure of a Core (First Transformer)]

As is shown in FIG. 7 and FIG. 8, in the first embodiment, the core 33 of the first transformer 3 is arranged with one first core block (lower side core block) 331 and another second core block (upper core block) 332 which sandwich the center part of the second substrate 2. The first core block 331 is arranged along the surface (back surface) 12B of the second substrate 12 and the opposing side surface 12C of the long side of the second substrate 12 and is arranged to cover these, and is inserted into the through hole 125 of the second substrate 12 in the center part of the surface 12B and includes a core central part 331C which is used as a toroidal magnetic core. This core central part 331C is formed as a single part with the first core block 331. The core central part 331C includes an oblong planar shape the same as the planar shape of the through hole 125 of the second substrate 12, and the planar shape of this core central part 331C is formed slightly smaller with respect to the planar shape of the through hole 125 in order to be inserted into the through hole 125. The second core block 332 is arranged along and covers the surface 12A of the second substrate 12. Although not shown in the figures, the first core block 331 and the second core block 312 are adhered together by an adhesive mixed with a gap material.

A cross section shape cut by the broken line F1-F1 shown in FIG. 7 of the first core block 331, that is, a cross section surface which passes through the core central part 331C from a part which runs along the side surface 12C of one long edge side of the second substrate, and across to a part which runs along the other side surface 12C, is formed in the shape of an E. A cross section shape cut by the broken line F2-F2 shown in FIG. 7 of the first core block 331, that is, a cross section surface from a side surface 12C of one long side of the substrate 12 across to the other side surface 12C, is formed in the shape of an I. In other words, the core 33 has an E-I type shaped core in the first embodiment.

The first core block 331 and the second core block 312 are formed for example, from a ferrite magnetic material (ferromagnetic material) in which a ferromagnetic material of a metal oxide has been sintered as a ceramic. In addition, the first core block 331 and the second core block 312 may also be formed by other amorphous magnetic materials.

Although these numerical values are not absolutely limited the first embodiment, the length which opposes the long edge of the second substrate 12 of the core 33 is set to, for example. 15 mm-17 mm, and the length which opposes the short edge is set to 19 mm-21 mm, and the thickness including the first core block 311 and the second core block is set to 5.0 mm-5.6 mm for example.

Furthermore, in the first embodiment, the core 33 does necessarily require an E-I core shape. The first core block 311 and the second core block 312 both may have a E shaped E-E core shape.

[Mounting Structure of the First Transformer]

As is shown in FIG. 1 to FIG. 5, the electronic circuit device 1 related to the first embodiment is mounted in a state in which one part in the thickness of the first transformer 3 is inserted into the aperture 15 of the first substrate 11. The aperture 15 here is formed by a through hole which reaches the surface (back surface) 11B from the opposing surface 11A of the first substrate 11. The aperture 15 is formed by a planer shape in which at least the second substrate 12 of the first transformer 3 and the core 33 can be inserted, and one part in the thickness direction of the second substrate 12 of the first transformer 3 and the core 33 is inserted into the aperture 15. In other words, the thickness of the first substrate 11 and the thickness of the first transformer 3 are superimposed, and the entire thickness can be reduced compared to the case where the first transformer is simply mounted in the surface 11A of the first substrate 11. In the first embodiment, the second substrate 12 and the core 33 shown in FIG. 7 are superimposed and the aperture 15 has similarity shape of a planar shape of the first transformer 3 so that two rectangular shapes seen from that normal direction and the surface 12A of the second substrate 12 are superimposed and has a planar shape slightly larger than the planar shape of the first transformer 3.

A first conductor 112 is arranged as a terminal in the periphery of the aperture 15 of the surface 11A of the first substrate 11 and a second conductor 122 (21) is arranged as a terminal in a region (specifically, each region of the connection hole wire 126(1), 126(3) respectively) of a connection hole wire 126 of the second substrate 12 of the first transformer 3. As is shown in FIG. 1, the terminal (first conductor 112) of the first substrate 11 and the terminal (122) of the second substrate 12 are electrically and mechanically connected by a strap lead 196. One end of the strap lead 196 is joined to the first conductor 112 of the first substrate 11 via a conducting adhesion material 13 and the other end is joined to the second conductor 122 of the second substrate 12 similarly via the conducting adhesion material 13.

The strap lead 196 is formed for example by a conducting material the same as a lead 181. That is, it is possible to practically use a Cu plate, Cu alloy plate, iron nickel alloy (Fe—Ni) plate for the strap lead 196. Solder, for example, is used for the conducting adhesion material.

[Structure and Mounting Structure of the Second Transformer]

Although the induced electromotive force and overall size of the second transformer 7 is smaller with respect to the first transformer 3, the second transformer 7 is formed by a sheet transformer structure the same as the structure of the first transformer 3. In addition, the second transformer 7 is mounted in a state in which it is inserted into the aperture 16 arranged on the first substrate 11, the same as the mounting method of the first transformer 3 to the first substrate 11.

[Structure of the Resin Sealing Body]

As is shown in FIG. 1 to FIG. 5 (shown by the broken line in FIG. 2), in the electronic circuit device 1 related to the first embodiment, the first substrate 11 on which electronic components such as the first transformer 3 are mounted as stated above is sealed air tight by the resin sealing body 17. The resin sealing body 17 is formed by a transfer mold method. The electronic circuit device 1 related to the first embodiment is a DC-DC converter transfer molded as one component, is appropriate for small scale and thinness, has high reliability and has increased usability.

In the first embodiment, the resin sealing body 17 is formed form a glass epoxy resin which is the same material as each of the first insulation substrates 111, 112 of the first substrate 11 and the second insulation substrate 121 of the second substrate 12. An epoxy resin having the qualities of a glass transition temperature Tg of 140° C., and a linear expansion coefficient of $12 \times 10^{-6}$/° C. for example, can be practically used for the resin sealing body 17

Although these numerical values are not absolutely limited in the first embodiment, the length of the long edge of the resin sealing body 17 is set to, for example, 68 mm-72 mm, and the length of the short edge is set to 48 mm-52 mm. The thickness of the resin sealing body 17 is set to 6.5 mm-6.9 mm for example.

Figure 2:
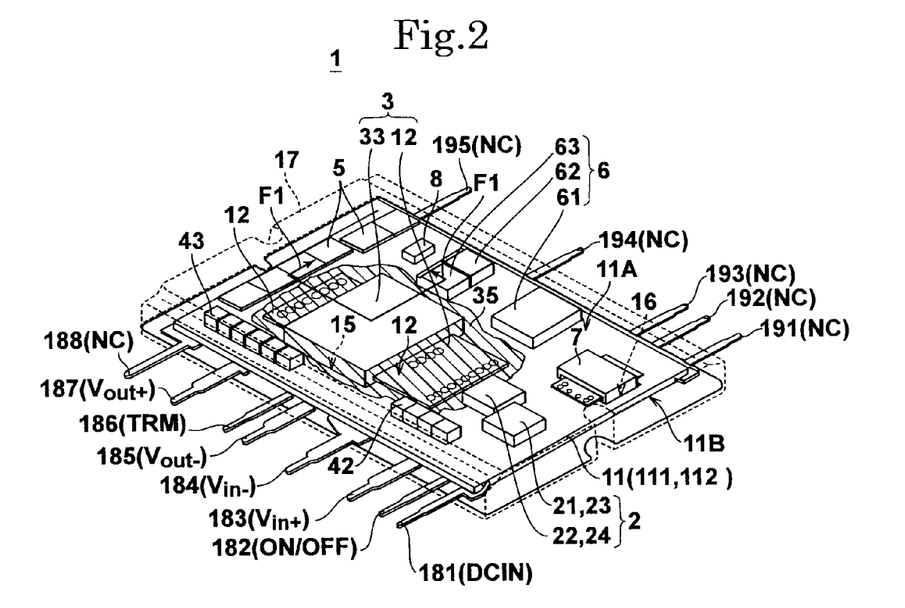
FIG. 2 is an oblique perspective view diagram of the electronic circuit diagram related to the first embodiment.
Figure 3:
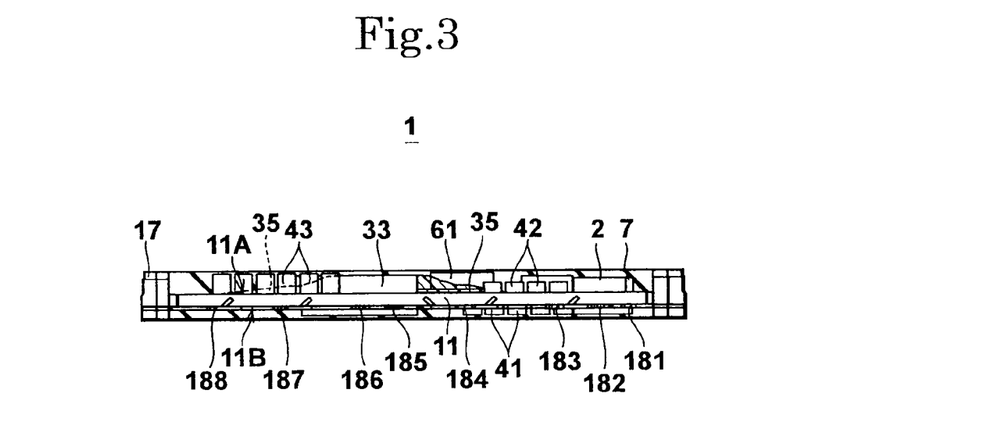
FIG. 3 is a side surface view diagram of the electronic circuit diagram shown in FIG. 2.

As is shown in FIG. 2, leads (outer leads) 181-188, 191-195 are respectively arranged in rows protruding from the side surface along the long edge of the resin sealing body 17. In FIG. 2, the lead 181 of the near side is used as a direct current voltage terminal DCIN, the lead 182 is used as a cut off signal terminal ON/OFF, the lead 183 is used as an input terminal Vin+, the lead 184 is used as an input terminal Vin−, the lead 185 is used as an output terminal Vout+, the lead 186 is used as an output voltage adjustment terminal TRM and the lead 187 is used as an output terminal Vout−. The lead 188 is used as an open terminal NC. In addition, in FIG. 2, the far side leads 191-195 are open terminals NC.

[Structure & Characteristics of the Curable Type Stress Relieving Material]

As is shown in FIG. 1 to FIG. 5 and particularly FIG. 1, in the first embodiment, the curable type stress relieving material 35 is arranged at least the entire region of only the four side surfaces (refer to FIG. 7) which are parallel to the side surface periphery of the core 33 of the first transformer 3, that is, parallel to each of the two long edges and two short edges of the second substrate 12 respectively. Here, the curable type stress relieving material 35 is arranged on the top surface and bottom surface of the core 33. The film thickness t of the curable type stress relieving material 35 is set thin as it departs from the side surface of the core 33. In other words, in FIG. 1, the film thickness t of the curable type stress relieving material 35 on the side surface of the core 33 is at its thickest and equivalent to the thickness between the top surface and bottom surface of the core 33 and. The film thickness t of the curable type stress relieving material 35 becomes gradually thinner as it departs from the side surface of the core 33, and the film thickness t2 of the curable type stress relieving material 35 at a position (end point) which is the furthest from the side surface of the core 33 is essentially zero. The cross sectional shape of the curable type stress relieving material 35 shown in FIG. 1, is formed by a triangular shape in which a part which runs along the edge of the surface 12A of the second substrate 12 is the bottom surface and a part which runs along the side surface of the core 33 is the height.

In the first embodiment, the curable type stress relieving material 35 is arranged on the side surface of the core 33 and also arranged up to the periphery of the aperture 15 of the first substrate 11 which includes a connection region (region in which the strap lead 196 is arranged) between the first substrate 11 and the second substrate 12. In other words, the curable type stress relieving material 35 arranged on the side surface of the core 33 of the first transformer 3 is extended up to a connection region between the first transformer 3 and the first substrate 11 on which it is mounted, and contributes to reducing the stress in this connection region.

In the first embodiment, for example, a heated curable type adhesive liquid form silicone rubber (thermoset silicone resin) having white semi-fluidity is most suitable for the curable type stress relieving material 35. This heated curable type adhesive liquid form silicone rubber has white semi-fluidity before curing, for example, has a viscosity of about 3.5 Pa-s-4.5 Pa-s at a temperature of 23° C. After coating using a coating technology or potting technology, the heated curable type adhesive liquid form silicone rubber is cured for example by a heating process for one hour at 150° C. After curing, the heated curable type adhesive liquid form silicone rubber changes to a white rubber form, has a hardness of, for example, 20-22 (type A), and a linear expansion coefficient of, for example, $2.0 \times 10^{-4}$/° C.-$2.2 \times 10$-4/° C.

Furthermore, the curable type stress relieving material 35 is not limited to a thermoset silicone resin. As long as the material reduced the stress produced by contraction of the resin sealing body 17 on the core 33 of the first transformer 3, an ultraviolet curable type silicone resin (rubber), a room temperature curable type silicone resin (rubber), or a thermoset type, ultraviolet curable type, room temperature curable type epoxy resin can be used as the curable type stress relieving material 35. Because a non-curable type, for example, a gel type resin flows out in a manufacturing process of the resin sealing body 17 which uses a transfer mold method, securely attaching a gel type resin to the side surface of the core 33 is difficult.

Figure 9:
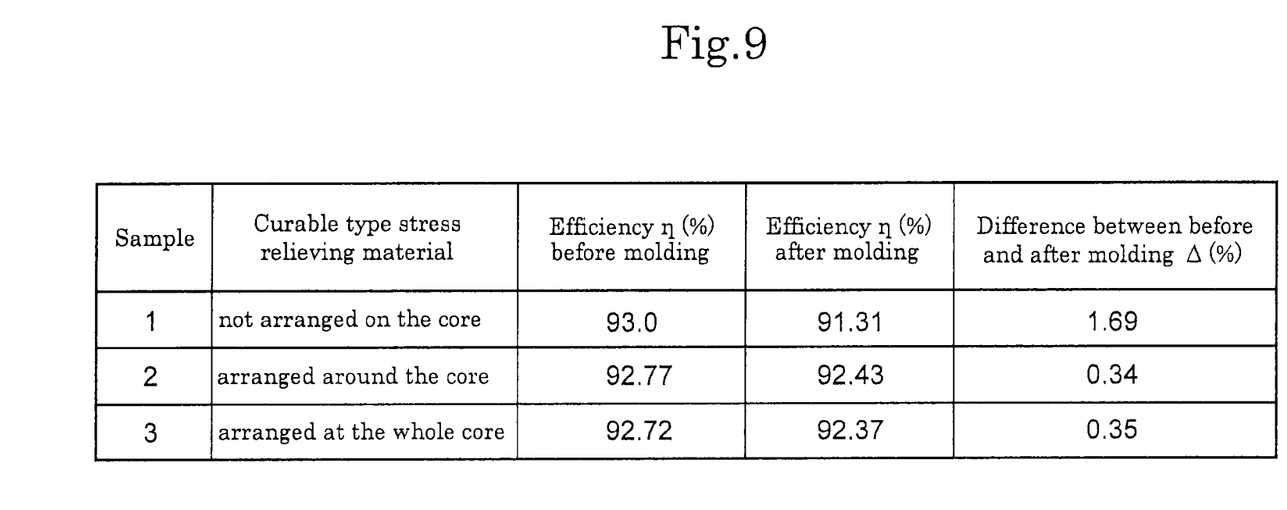
FIG. 9 is a diagram for explaining the change in characteristics of the first transformer due to the presence or not of a curable type stress relieving material and a change in an arrangement region in the electronic circuit device related to the first embodiment.

As is shown in FIG. 9, the power conversion efficiency of the first transformer 3 changes depending on the presence of the curable type stress relieving material 35 and the difference in the arrangement region of the curable type stress relieving material 35. In sample 1 in FIG. 9, the curable type stress relieving material 35 related to the first embodiment is not arranged on the core 33 of the first transformer 3. In this sample 1, the power conversion efficiency ratio η before molding of the resin sealing material 17 of the first transformer is reduced (changes) after molding, and the power conversion efficiency ratio difference Δη between before and after molding is 1.69%.

Sample 2 is the electronic circuit device 1 related to the first embodiment and the curable type stress relieving material 35 is arranged on the side surface entire region of the core 33 of the first transformer 3. In this sample 2

The power conversion efficiency ratio η before molding of the resin sealing body 17 of the first transformer 3 is slightly reduced after molding and the power conversion efficiency ratio difference Δη before and after molding is 0.34%. The power conversion efficiency ratio difference Δη of sample 2 is reduced by as much as 25% with respect to the power conversion efficiency difference ratio Δη of sample 1.

In sample 3, the curable type stress relieving material 35 is arranged on the entire upper surface and entire lower surface in addition to the entire side surface of the core 33, that is, the entire surface of the first transformer 3. In this sample 3, the power conversion efficiency ratio η before molding of the resin sealing material 17 of the first transformer is slightly reduced (after molding, and the power conversion efficiency ratio difference Δη between before and after molding is 0.35%.

There is no large difference between the power conversion efficiency ratio difference Δη of sample 3 and the power conversion efficiency ratio difference Δη of sample 2. That is, in the electronic circuit device 1 of the first embodiment, it is possible to sufficiently reduce the power conversion efficiency ratio difference Δη just by arranging the curable type stress relieving 35 only on the side surface periphery of the core 33 of the first transformer 3, and it is possible to sufficiently reduce stress produced by expansion and contraction of the resin sealing body 17. Furthermore, it is possible to reduce the thickness of the resin sealing body 17 and realize small scale and thinness of the electronic circuit device 1 by not arranging the curable type stress relieving material 35 on the upper surface and lower surface of the core 33 of the first transformer 3.

[Characteristics Related to the First Embodiment]

In the electronic circuit device 1 related to the first embodiment described above, the curable type stress relieving material 35 us arranged on the side surface periphery of the core (magnetic body) 33 of the first transformer 3, and because it is possible to reduce the stress applied to the core 33 by the resin sealing body 17 using the curable type stress relieving material 35, it is possible to prevent changes in characteristics and breaks in the core 33 due to the stress applied the core 33. Furthermore, in the electronic circuit device 1, the curable type stress relieving material 35 is arranged on one part which is the side surface periphery of the core 33 of the first transformer 3, and because the entire region including the upper and lower surfaces of the core 33 are not covered by the curable type stress relieving material 35, it is possible to reduce the thickness of the resin sealing body 17 and realize small scale and thinness.

In addition, in the electronic circuit device 1 related to the first embodiment, because the curable type stress relieving material 35 is also arranged on a connection part between the first substrate 11 and the first transformer 3 (the second substrate 12 of the first transformer 3), it is possible to reduce the stress applied to the connection part by the resin sealing body 17, and prevent connection defects.

(Second Embodiment)

The second embodiment of the present invention explains a transformed example of the electronic circuit device 1 related to the first embodiment.

Figure 10:
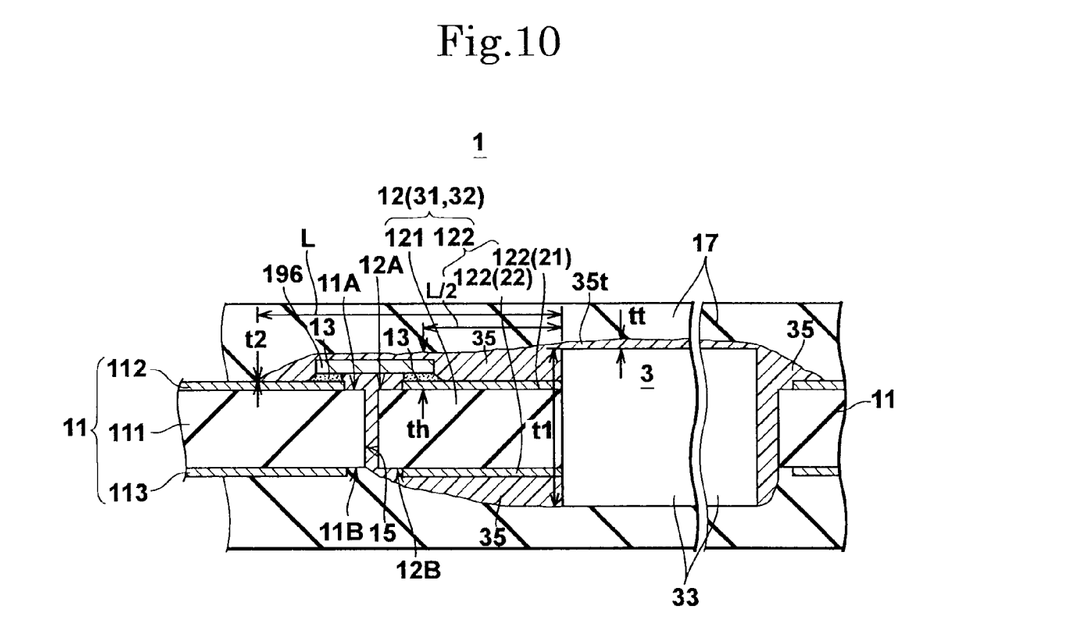
FIG. 10 is an enlarged cross sectional diagram of the main components of an electronic circuit device related to a second embodiment of the present invention.

In the electronic circuit device 1 related to the second embodiment, as is shown in FIG. 10 the curable type stress relieving material 35 is arranged on the side surface periphery of the core 33 of the first transformer 3 and a curable type stress relieving material 35t is also arranged on the top surface of the core 33. The curable type stress relieving material 35t is formed in the same manufacturing process and both are consecutively connected. However, because the thickness of the resin sealing body 17 is formed thinly, the curable type stress relieving material 35t arranged on the top surface of the core 33 is formed in a thin film thickness compared to the curable type stress relieving material 35 arranged on the side surface periphery of the core 33.

The same as the electronic circuit device 1 related to the first embodiment, in the electronic circuit device 1 related to the second embodiment, a cross sectional shape of the curable type stress relieving material 35 has a triangular shape and the film thickness of the curable type stress relieving material 35 is gradually formed thinner from the side surface of the core 33. Because the average film thickness of the curable type stress relieving material 35 is equivalent to the film thickness th at half width (L/2) of half the distance from the side surface to the end of the core 33 of the curable type stress relieving material 35, a film thickness tt of the curable type stress relieving material 35 is set thinner compared to this film thickness th.

In the electronic circuit device 1 related to the second embodiment formed in this way, basically it is possible to obtain the same operational effects as the electronic circuit device 1 related to the first embodiment described above. Furthermore, because it is not necessary to separate coating of the curable type stress relieving materials 35 and 35t on the border between the side surface periphery and top surface of the core 33, it is easy to form the curable type stress relieving materials 35 and 35t.

(Third Embodiment)

The third embodiment of the present invention explains another transformed example of the electronic circuit device 1 related to the first embodiment.

Figure 11:
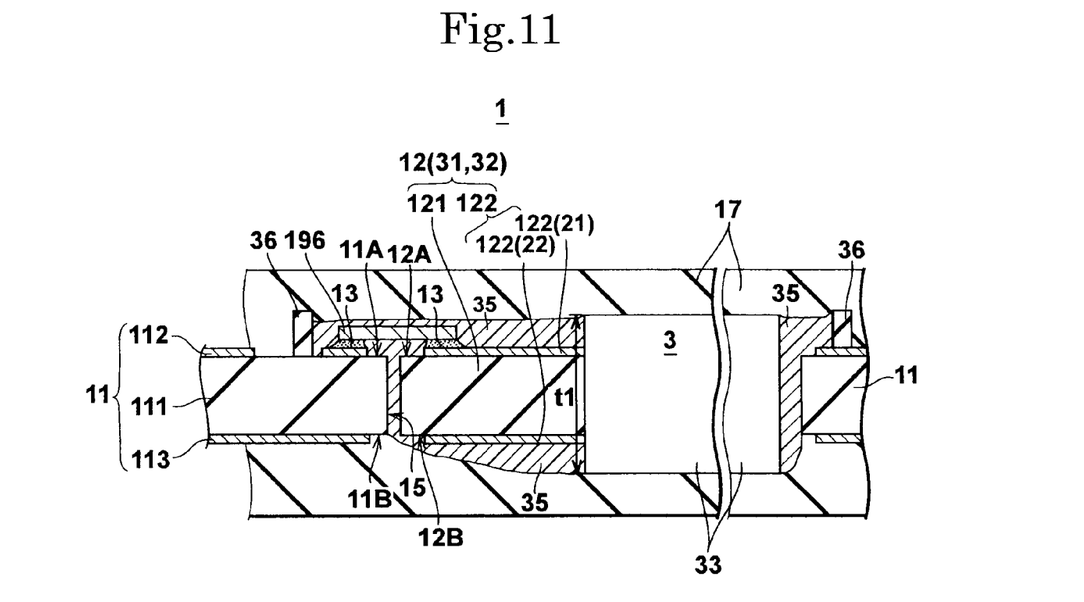
FIG. 11 is an enlarged cross sectional diagram of the main components of an electronic circuit device related to a third embodiment of the present invention.

In the electronic circuit device 1 related to the third embodiment, as is shown in FIG. 11, a dam 26 is arranged which surrounds the first transformer 3 on the surface 11A of the first substrate 11 in a periphery which is separated from the side surface periphery of the core (magnetic body) 33 of the first transformer 3, and the curable type stress relieving material 35 is arranged within a depression produced by the side surface of the core 33, surface 12A of the second substrate 12, surface 11A of the first substrate 11 and side surface side of the first transformer 3 of the dam 36. The dam 36 determines the position of the end of the curable type stress relieving material 35 and blocks an outflow of the curable type stress relieving material 35. In other words, by arranged the dam 36 it is possible to form the curable type stress relieving material 35 having a necessary thickness in a necessary region.

The dam 36 is formed from the same material, for example, as the first substrate 11 and specifically, from an epoxy based resin, and is attached to the surface 11A of the first substrate 11 with an adhesive. In addition, the dam 36 is not limited to a resin. The dam 36 may also be formed by an insulating material such as ceramics or glass or a conducting material or metallic material such as Cu or aluminum (Al).

In the electronic circuit device 1 related to the third embodiment formed in this way, basically it is possible to obtain the same operational effects as the electronic circuit device 1 related to the first embodiment described above. Furthermore, by arranging the dam 36 it is easy to form the curable type stress relieving material 35 with a necessary thickness in a necessary region.

Furthermore, it is possible to combine the electronic circuit device 1 related to the third embodiment with electronic circuit device 1 related to the second embodiment. That is, in the electronic circuit device 1, the curable type stress relieving material 35 in which the end position is defined by the dam 36 is arranged in the side surface periphery of the core 33 of the transformer 3, and the curable type stress relieving material 35t with a thin film thickness is arranged on the top surface of the core 33.

(Other Embodiments)

As stated above, the present invention was explained by the first to third embodiments, however, the descriptions and figures which describe a part of this disclosure are not limited to this invention. For example, in the electronic circuit device 1 related to the embodiments stated above, an example was explained whereby the curable type stress relieving material 35 is arranged on the core 33 of the first transformer 3, however, in the present invention, the curable type stress relieving material 35 may also be arranged on the second transformer 7. In addition, in the electronic circuit device 1 related to the embodiments stated above, an example was explained whereby the first transformer 3 and the second transformer 7 are mounted on the first substrate as electronic components. However, the present invention can be applied to an electronic circuit device in which an inductor with a coil wound around a magnetic body is mounted on the first substrate.

As explained above, according to the present invention, it is possible to provide an electronic circuit device in which stress produced on a magnetic body can be reduced and also realize thinness and small scale.

What is claimed is:

1. An electronic circuit device comprising:
a substrate having an aperture and mounted with electronic components;
a sheet transformer having a core formed from a stacked substrate arranged with a winding wire, and a magnetic body wedged in a part of the stacked substrate, the sheet transformer inserted and arranged within the aperture of the substrate;
a curable stress relieving material arranged from an entire periphery of a side surface of the magnetic body across the substrate, a film thickness of the curable stress relieving material gradually thinning in a direction away from the side surface of the magnetic body, the curable stress relieving material arranged on both surfaces of the substrate through the aperture of the substrate, a cross sectional shape of the curable stress relieving material formed by a triangular shape in which a part which runs along the edge of the surface of the stacked substrate is a bottom and apart which runs along the side surface of the magnetic body is a height; and
a resin sealing body directly covering an entirety of the whole of the substrate, the sheet transformer, and the curable stress relieving material.

2. The electronic circuit device according to claim 1, wherein the curable stress relieving material is also arranged in a connection region between the stacked substrate of the sheet transformer and the substrate.

3. The electronic circuit device according to claim 1, wherein the curable stress relieving material is a silicon resin or an epoxy resin of one of either a thermal curable type, ultraviolet curable type or room temperature curable type, and the resin sealing body is an epoxy resin.

* * * * *